United States Patent [19]

Takechi

[11] Patent Number: 4,868,707
[45] Date of Patent: Sep. 19, 1989

[54] SUPERCONDUCTING ELECTROMAGNET APPARATUS

[75] Inventor: Moriaki Takechi, Ako, Japan

[73] Assignee: Mitsubishi Denki Kabushiki Kaisha, Japan

[21] Appl. No.: 210,082

[22] Filed: Jun. 22, 1988

[30] Foreign Application Priority Data

Jun. 23, 1987 [JP] Japan .................................. 62-154567

[51] Int. Cl.$^4$ ........................................... H01H 47/00
[52] U.S. Cl. ..................................... 361/141; 335/216
[58] Field of Search .................. 361/141, 19; 335/216; 324/320, 322

[56] References Cited

U.S. PATENT DOCUMENTS

| | | | |
|---|---|---|---|
| 3,419,904 | 12/1968 | Weaver et al. | 361/141 |
| 3,818,396 | 6/1974 | Raphael | 361/141 |
| 4,535,291 | 8/1985 | Lee et al. | 361/141 |

FOREIGN PATENT DOCUMENTS

| | | |
|---|---|---|
| 60-123756 | 7/1985 | Japan . |
| 8330198 | 11/1983 | United Kingdom . |
| 8400684 | 1/1984 | United Kingdom . |

*Primary Examiner*—L. T. Hix
*Assistant Examiner*—David M. Gray
*Attorney, Agent, or Firm*—Leydig, Voit & Mayer

[57] ABSTRACT

A superconducting electromagnet apparatus wherein a superconducting main coil and a superconducting shield coil for reducing external magnetic field leakage generated by the main coil are magnetically, but not electrically, coupled, a single magnetizing power source is connected across the main coil, and persistent currect switches are respectively connected in parallel with the main coil and the shield coil.

3 Claims, 5 Drawing Sheets

$$I_1' = I_{1n} - \frac{L_2}{M}I_{2n}$$

$$I_2 = -\frac{M}{L_2}\left(\frac{L_2}{M}I_{2n}\right)$$
$$= -I_{2n}$$

SUPERCONDUCTING ELECTROMAGNET APPARATUS

BACKGROUND OF THE INVENTION

1. Field of the Invention

This invention relates to a superconducting electromagnet apparatus, and more particularly to a superconducting electromagnet apparatus for use in a magnetic resonance imaging system.

2. Description of the Prior Art

In general, an electromagnet for a magnetic resonance imaging system needs to generate a highly intense and homogeneous magnetic field in an imaging space within the opening of the electromagnet. In generating such a magnetic field, superconducting electromagnet apparatus in the prior art has a problem in that the magnetic field leaks outside the electromagnet adversely affecting peripheral equipment. It is therefore desirable that the magnetic field leakage be reduced by subjecting the electromagnet to magnetic shielding.

An expedient for the magnetic shielding of the electromagnet is a method in which the electromagnet is surrounded with a magnetic substance. This method, however, has the disadvantage that the weight of the apparatus increases so that high load bearing strength is required at the place of installation. For this reason, a method is employed in which a coil for generating a magnetic field opposite in polarity to that of the main coil is disposed around the main coil.

FIG. 1 is a sectional view showing the construction of an electromagnet which is used in the prior-art superconducting electromagnet apparatus described above. A superconducting main coil (hereinbelow, simply termed "main coil") 1 and a superconducting shield coil (herebelow, simply termed "shield coil") 2, which is disposed around the main coil 1 and which reduces external magnetic field leakage from the main coil 1, are housed in an inner vessel 3 and are cooled to and held at a cryogenic temperature. The inner vessel 3 is further enclosed within a vacuum vessel 4 for the purpose of vacuum thermal insulation. A thermally-insulating shield 5 is interposed between the inner vessel 3 and the vacuum vessel 4.

FIG. 2 is an electric connection diagram of the prior-art superconducting electromagnet apparatus. The main coil 1 and the shield coil 2 are connected in series, and a persistent current switch 6 is connected in parallel with the series connection assembly. The resulting parallel connection assembly is connected to a magnetizing power source 10 through current leads 7, detachable current leads 8 and current leads 9. The persistent current switch 6 is combined with a heater 11, which is connected to a heater power source 14 through current leads 12, detachable current leads 8 and current leads 13.

In such a superconducting electromagnet apparatus, the shield coil 2 establishes a homogeneous resultant magnetic field in the internal operating space of the electromagnet in superposition on a magnetic field generated by the main coil 1, and it also generates an external magnetic field opposite in polarity to the external magnetic field leakage generated by the main coil 1, thereby to reduce the resultant magnetic field combined with the magnetic field of the main coil 1.

In magnetizing the electromagnet, the detachable current leads 8 are attached to connect the magnetizing power source 10 and the heater power source 14, and the heater 11 is energized by the heater power source 14 so as to open the persistent current switch 6, whereby the main coil 1 and shield coil 2 connected in series are supplied with current from the magnetizing power source 10. After the current has reached a predetermined value, the persistent current switch 6 is closed. Then, the main coil 1 and the shield coil 2 form a series closed circuit, so that a persistent current operation is performed.

With the prior-art superconducting electromagnet apparatus shown in FIG. 2, since the main coil 1 and the shield coil 2 are connected in series, the conduction currents thereof are equal, and the homogeneous resultant magnetic field needs to be established in the internal operating space of the electromagnet with the identical current. Therefore, such an apparatus has problems in that the size of the conductors and the shapes of the coils are limited, making it uneconomical.

In order to relieve this problem, a superconducting electromagnet apparatus as shown in FIG. 3 has been employed. In this superconducting electromagnet apparatus, a persistent current switch 6a is connected in parallel with the main coil 1, and it is combined with a heater 11a. Further, the main coil 1 is also connected to a magnetizing power source 10a through current leads 7a, detachable current leads 8A and current leads 9a, while the heater 11a is connected to a heater power source 14a through current leads 12a, detachable current leads 8A and current leads 13a. Likewise, a persistent current switch 6b is connected in parallel with the shield coil 2, and it is combined with a heater 11b. Further, the shield coil 2 is also connected to a magnetizing power source 10b through current leads 7b, detachable current leads 8A and current leads 9b, while the heater 11b is connected to a heater power source 14b through current leads 12b.

With the superconducting electromagnet apparatus in FIG. 3, the main coil 1 and the shield coil 2 are electrically independent of each other and have independent magnetizing circuits, so that they can be operated with currents different from each other. This superconducting electromagnet apparatus, however, has problems in that, since current leads are required for the two circuits for the main coil and for the shield coil, the number of internal circuits for the detachable current leads 8A increases, increasing the size of the apparatus, and also two magnetizing power sources are required.

As thus far described, the prior-art superconducting electromagnet apparatus has had the problems of being uneconomical due to the limitations on the sizes of conductors and the shapes of the coils or the problems of being too large and requiring two magnetizing power sources.

SUMMARY OF THE INVENTION

This invention has been made in order to solve the problems as mentioned above, and has for its object to provide a superconducting electromagnet apparatus which need not equalize the currents of a main coil and a shield coil and which can magnetize an electromagnet with a single magnetizing power source.

The superconducting electromagnet apparatus according to this invention comprises a main coil and a shield coil to which persistent current switches are respectively connected in parallel, and a magnetizing power source connected across the main coil.

In this invention, the persistent current switches are respectively connected in parallel with the main coil and the shield coil, so that the main coil and the shield coil form independent closed circuits and can be brought into persistent current operations with currents different from each other. In addition, the main coil and the shield coil can be energized to current values different from each other with the single magnetizing power source by opening and closing the persistent current switch of the shield coil.

DESCRIPTION OF THE PREFERRED EMBODIMENT

Now, an embodiment of this invention will be described with reference to the accompanying drawings.

Figure 1:
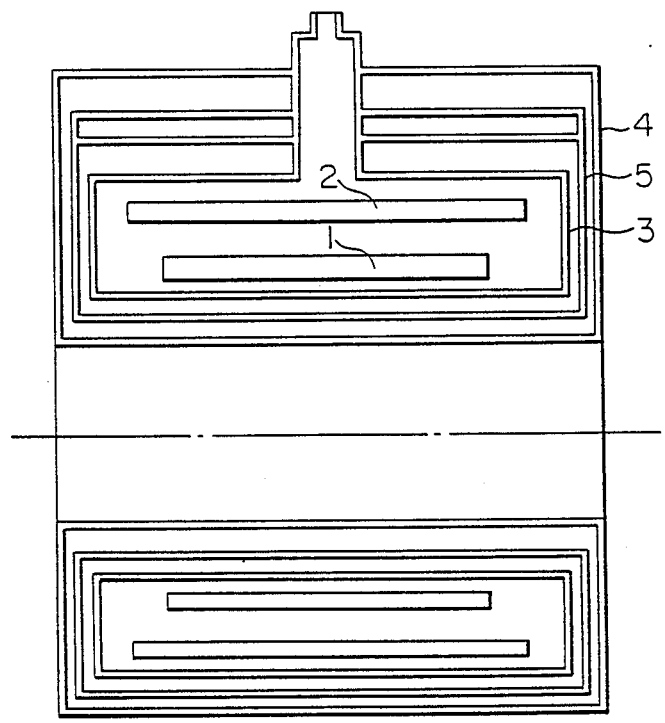
FIG. 1 is a sectional view showing the construction of an electromagnet.
Figure 2:
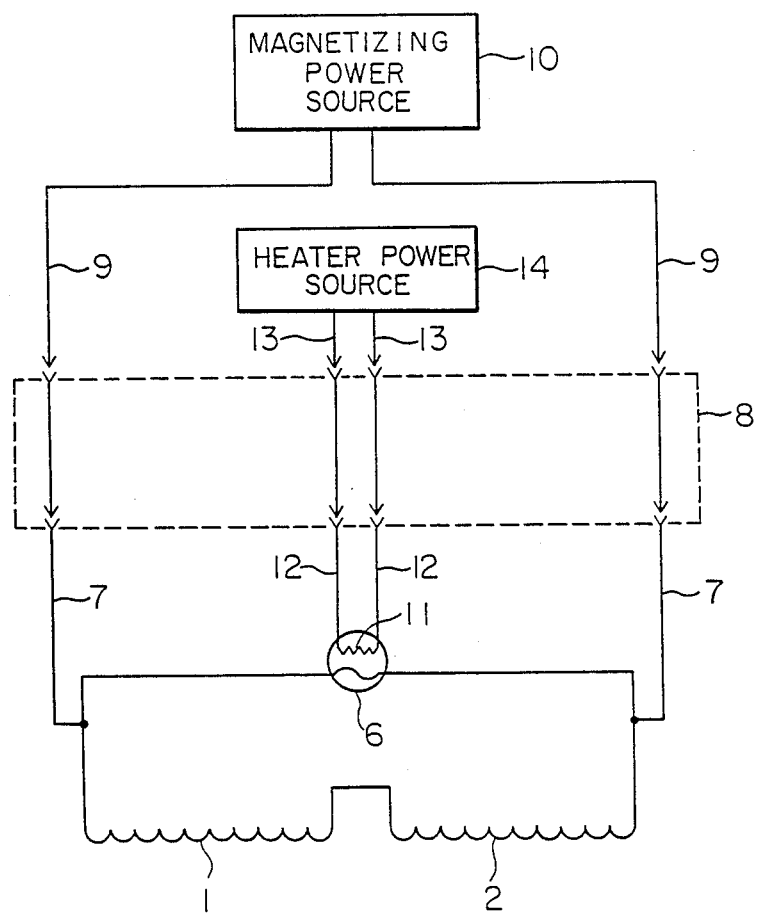
FIG. 2 is an electric connection diagram of a prior-art superconducting electromagnet apparatus.
Figure 3:
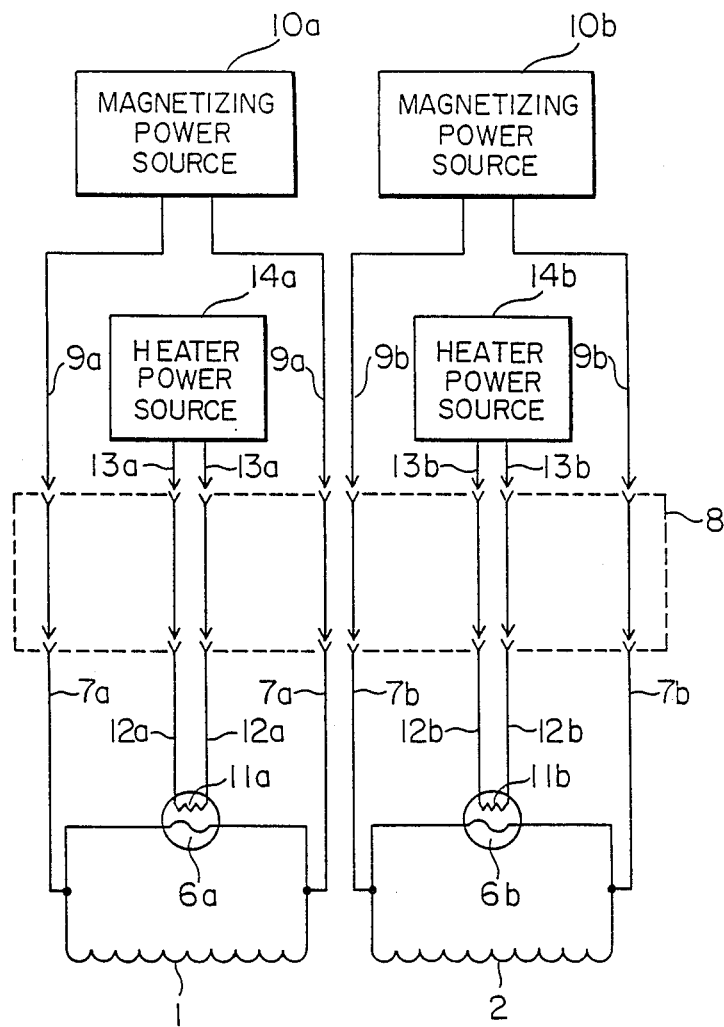
FIG. 3 is an electric connection diagram of another prior-art superconducting electromagnet apparatus.
Figure 4:
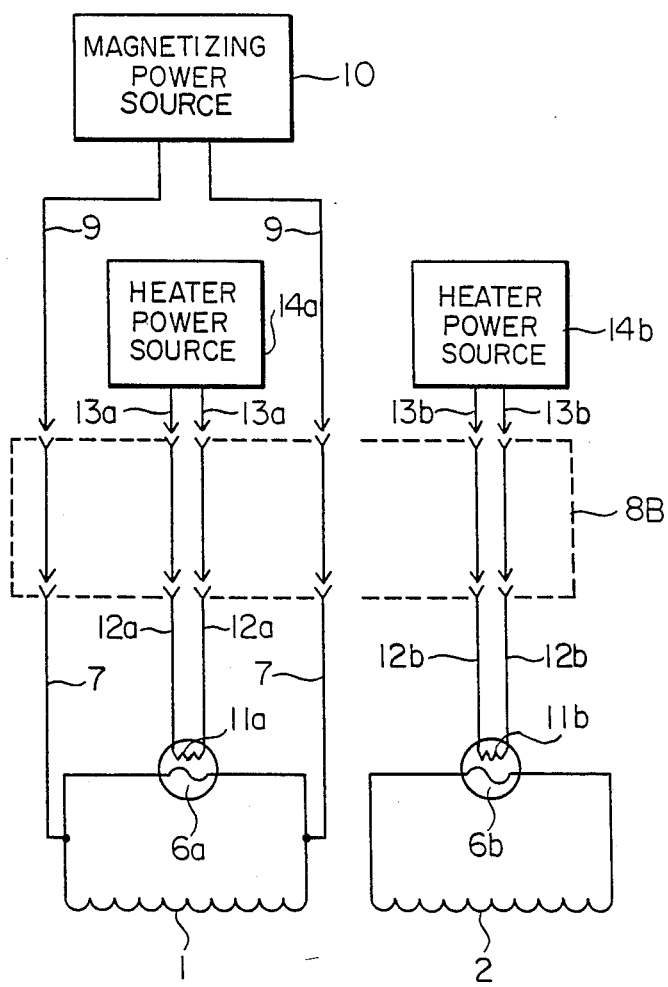
FIG. 4 is an electric connection diagram of an embodiment of this invention.

FIG. 4 is an electric connection diagram showing one embodiment of this invention. A persistent current switch 6a is connected in parallel with a main coil 1, while a persistent current switch 6b is connected in parallel with a shield coil 2. The persistent current switches 6a and 6b are respectively combined with heaters 11a and 11b. The main coil 1 is connected to a magnetizing power source 10 through current leads 7, detachable current leads 8B and current leads 9. The heater 11a combined with the persistent current switch 6a is connected to a heater power source 14a through current leads 12a, detachable current leads 8B and current leads 13a. Likewise, the heater 11b combined with the persistent current switch 6b is connected to a heater power source 14b through current leads 12b, detachable current leads 8B and current leads 13b.

Further, the shield coil 2, magnetically coupled to the main coil 1 establishes a homogeneous resultant magnetic field in superposition on a magnetic field generated in the internal space of an electromagnet by the main coil 1, and it generates a magnetic field opposite in polarity to a magnetic field established in the external space of the electromagnet by the main coil 1, thereby reducing the external space of the external magnetic field leakage. In addition, although both the main coil 1 and the shield 2 are illustrated as single solenoid coils, they are usually constructed of a plurality of coils in order to establish the homogeneous magnetic field (which is necessary for magnetic resonance imaging) in the operating space inside the electromagnet.

Next, the method of magnetizing the superconducting electromagnet apparatus according to this invention will be described with reference to FIGS. 4, 5a, 5b and 5c. In order to facilitate description of the invention, it is assumed that $I_{1n}$ denotes the operating current of the main coil 1, $I_{2n}$ and $L_2$ denote the operating current and self-inductance of the shield coil 2, respectively, and M denotes the mutual inductance between the main coil 1 and the shield coil 2 with $I_{1n} > I_{2n}$. However, even if the magnitudes of current and inductance are different from those mentioned above, the object of this invention can still be accomplished.

Figure 5A:
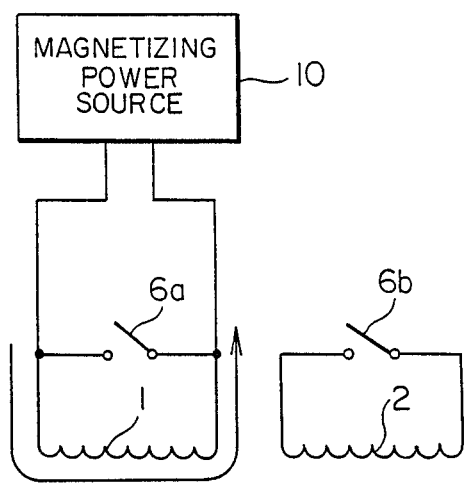
FIGS. 5a and 5b are circuit diagrams for explaining a method of magnetizing the embodiment shown in FIG. 4.

First, the detachable current leads 8B are attached to the superconducting electromagnet apparatus to connect the magnetizing power source 10 and the heater power sources 14a, 14b, thereby to form the circuit arrangement in FIG. 4. The heaters 11a and 11b are respectively energized by the heater power sources 14a and 14b, to open the persistent current switches 6a and 6b and to supply the main coil 1 with current from the magnetizing power source 10. In this state, current flows into the main coil 1 as illustrated in FIG. 5a, but current does not flow into the shield coil 2 since it is opened by the persistent current switch 6b and is not connected to a power source.

Figure 5B:
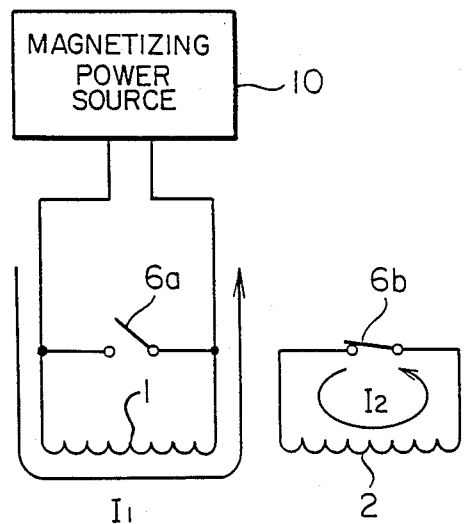

After the current flowing into the main coil 1 has reached the value $$I_1' = I_{1n} - \frac{L_2}{M} I_{2n},$$

which is determined by the inductances and operating currents of the coils, the energization of the heater 11b of the persistent current switch 6b connected in parallel with the shield coil 2 is stopped to close the persistent current switch 6b. Then, as illustrated in FIG. 5b, the shield coil 2 forms a superconducting closed circuit together with the persistent current switch 6b connected in parallel with the coil. A flow is induced to the shield coil 2 due in its magnetic coupling with the main coil 1. The current $I_2$ induced in the shield coil 2 is determined by the inductances of the coils and the component of current change, and is expressed by the following formula when the current of the main coil 1 is increased from $I_1'$ to $I_{1n}$.

$$I_2 = -\frac{M}{L_2}(I_{1n} - I_1') = -\frac{M}{L_2} \cdot \frac{L_2}{m} I_{2n}$$

Figure 5C:
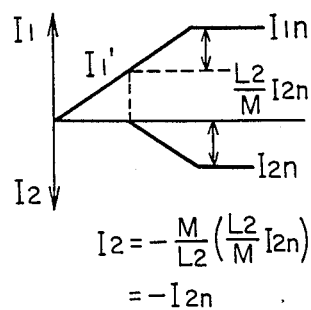
FIG. 5c is a graphic diagram for explaining the operation of the circuits shown in FIGS. 5a and 5b.

Namely, the current corresponding to the operating current $I_{2n}$ of the shield coil 2 is induced as illustrated in FIG. 5c.

According to this arrangement, the main coil 1 and the shield coil 2 can be operated with unequal currents since they form independent closed circuits, and the operating current for each coil can be set to the optimum value. In addition, the value of the current flowing in the shield coil 2 can be changed to meet the conditions of the place where the apparatus is installed. The magnetic shielding effect due to the shield coil 2 can be also changed.

Furthermore, according to this arrangement, only one set of detachable current leads 8B and the magnetizing power source 10 are required. The apparatus can be reduced in cost in comparison with cases in which detachable current leads and a magnetizing power source are respectively provided for both the main coil 1 and the shield coil 2.

As described above in detail, this invention brings forth the effects that a main coil and a shield coil magnetically coupled thereto can be operated with unequal currents, since persistent current switches are respectively connected in parallel with the main coil and the shield coil. A single magnetizing power source is connected across the main coil so that the apparatus can be fabricated inexpensively. A magnetic shielding effect based on the shield coil can be varied, since the operating current of the shield coil can be set at will.

What is claimed is:

1. A superconducting electromagnet apparatus comprising a superconducting main coil, a superconducting shield coil for reducing leakage of the magnetic field generated by said main coil, persistent current switches respectively connected in parallel with said main coil and said shield coil, and a single magnetizing power source connected across said main coil wherein said main and shield coils are magnetically, but not electrically, coupled to each other for induction of an electrical current flow in said shield coil by an electrical current flow in said main coil, and wherein no magnetizing power source is provided for connection to said shield coil.

2. A superconducting electromagnet apparatus according to claim 1 wherein each of said persistent current switches includes a heater and including a heater power source connected across each of said heaters.

3. A method of generating a shielding magnetic field to cancel at least part of a main magnetic field using a single magnetizing power supply for energizing magnetically coupled, but electrially uncoupled, superconducting main and shield coils, each coil including, electrically connected in parallel, a persistent current switch comprising:

establishing an initial magnitude current flow in said main coil from said single magnetizing power supply while the persistent current switches are open;

closing the persistent current switch of said shield coil so that a persistent current flow is induced in said shield coil through the magnetic coupling of said main and shield coils;

increasing the magnitude of the current flowing in said main coil from said single magnetizing power supply to a desired magnitude and closing the persistent current switch of said main coil whereby current flow of a desired magnitude is established in said main coil and the magnitude of the current flowing in said shield coil is increased to a desired level; and disconnecting said single magnetizing power supply from said main coil.

* * * * *